United States Patent
Ishikawa

(10) Patent No.: US 8,947,943 B2
(45) Date of Patent: Feb. 3, 2015

(54) MEMORY SYSTEM AND CONTROL METHOD THEREFOR

(71) Applicant: PS4 Luxco S.a.r.l., Luxembourg (LU)

(72) Inventor: Toru Ishikawa, Tokyo (JP)

(73) Assignee: PS4 Luxco S.a.r.l., Luxembourg (LU)

(*) Notice: Subject to any disclaimer, the term of this patent is extended or adjusted under 35 U.S.C. 154(b) by 0 days.

(21) Appl. No.: 14/295,707

(22) Filed: Jun. 4, 2014

(65) Prior Publication Data

US 2014/0286107 A1 Sep. 25, 2014

Related U.S. Application Data

(63) Continuation of application No. 13/924,033, filed on Jun. 21, 2013, now Pat. No. 8,780,643, which is a continuation of application No. 13/155,657, filed on Jun. 8, 2011, now Pat. No. 8,514,635.

(30) Foreign Application Priority Data

Jun. 25, 2010 (JP) ................................. 2010-145514

(51) Int. Cl.
*G11C 7/10* (2006.01)
*G11C 7/22* (2006.01)
*G11C 5/02* (2006.01)
*G11C 5/06* (2006.01)

(52) U.S. Cl.
CPC ................ *G11C 7/10* (2013.01); *G11C 7/1066* (2013.01); *G11C 7/22* (2013.01); *G11C 5/02* (2013.01); *G11C 5/06* (2013.01)
USPC .................. 365/189.03; 365/189.05; 365/194; 365/233.1; 365/233.13

(58) Field of Classification Search
USPC ........ 365/189.03, 189.05, 194, 233.1, 233.13
See application file for complete search history.

(56) References Cited

U.S. PATENT DOCUMENTS 7,656,732 B2 * 2/2010 Kuroda .......................... 365/207

FOREIGN PATENT DOCUMENTS

| JP | 2002-324398 A | 11/2002 |
| JP | 2004-524641 A | 8/2004 |
| JP | 2008-140220 A | 6/2008 |

* cited by examiner

*Primary Examiner* — Toan Le

(57) ABSTRACT

A memory system includes a plurality of memory devices having data terminals that are commonly connected to a memory controller. Each of the memory devices includes a data output circuit that outputs read data that is read from a memory cell array in response to a read command to the data terminal, and an output-timing adjustment circuit that adjusts an output timing of read data that is output from the data output circuit. The memory controller sets an adjustment amount of adjustment performed by an output-timing adjustment circuit such that delay times from when the read command is issued until when the read data is received match in the memory devices, by issuing a setting command to each of the memory devices.

12 Claims, 17 Drawing Sheets

MEMORY SYSTEM AND CONTROL METHOD THEREFOR

REFERENCE TO RELATED APPLICATIONS

This application is a continuation of U.S. patent application Ser. No. 13/924,033, filed Jun. 21, 2013, which claims priority to U.S. patent application Ser. No. 13/155,657 (now U.S. Pat. No. 8,514,635), filed Jun. 8, 2011, which claims priority to JP Patent Application No. 2010-145514, filed Jun. 25, 2010, the contents of which prior applications are incorporated herein in their entirety by reference.

BACKGROUND OF THE INVENTION

1. Field of the Invention

The present invention relates to a memory system and a control method therefor, and more particularly relates to a memory system having a configuration in which a plurality of memory devices are commonly connected to a memory controller and a control method for the memory system.

2. Description of Related Art

In a memory system including a memory device such as a DRAM (Dynamic Random Access Memory), there are cases that a plurality of memory devices are commonly connected to a memory controller so as to increase the memory capacity of the entire system. The memory controller is a control device that issues various commands such as a read command and a write command to the memory devices, as well as receiving read data and transmitting write data. The memory controller is mainly provided between a CPU (Central Processing Unit) and memory devices, but occasionally the CPU itself functions as the memory controller.

As described above, in the case of a memory system in which a plurality of memory devices are commonly connected to a memory controller, there is a variation in a time taken from when the memory controller issues a read command until when each of the memory devices receives read data. This variation is caused by various factors such as that caused by a manufacturing process or that caused by a wiring load. A variation caused by a wiring load is cancelled in almost all cases in a memory system in which memory devices are stacked, for example. However, the variation caused by a manufacturing process cannot be cancelled in the memory system, and this variation appears as a time difference that is not negligible.

When there is a variation in a delay time from when the memory controller issues a read command until when each of the memory devices receives read data, a latch margin of read data at a memory controller side decreases. For example, when a memory device with a long delay time and a memory device with a short delay time are continuously accessed, read data from the memory device with the long delay time and read data from the memory device with the short delay time are partially duplicated with each other. Therefore, an effective width (a pass window) of these read data becomes narrower. Furthermore, there is another problem that, when logic levels of the read data from the memory device with the long delay time and the read data from the memory device with the short delay time which are continuously read out are different, a through current flows during a duplicating period of the read data.

Japanese Patent No. 3558599 proposes a method of preventing such a problem of a variation in delay times.

However, according to the method described in Japanese Patent No. 3558509, because adjustment of delay times is performed corresponding to a delay time that is monitored as needed, the adjustment may not be able to catch up with the data transmission when it is a considerably high speed. Therefore, there has been demanded a method that is capable of reliably cancelling a variation in delay time even when data is transmitted at a considerably high speed.

SUMMARY

In one embodiment, there is provided a device comprising: a plurality of memory chips, each of the memory chips comprising: a memory cell array; an access control circuit responding to receipt of an access command and accessing the memory cell array to produce read data therefrom; a plurality of data terminals; a data output circuit coupled between the memory cell array and the data terminals; and an output timing adjustment circuit producing an output clock signal in response to adjustment data stored therein, the output clock signal causing the data output circuit to drive the data terminals so that output data based on the read data appear at the output terminals after a predetermined period of time from the receipt of the access command, the predetermined period of time being adjustable in accordance with the adjustment data; and a plurality of data paths, the memory chips being connected at the data output terminals in common to the data paths such that a selected one of the memory chips is allowed to transfer the output data to the data paths via the data terminals thereof; the output timing adjustment circuits of at least two of the memory chips being stored with different adjustment data from each other so that the at least two of the memory chips are approximately equal in the predetermined period of time to each other.

In another embodiment, there is provided a device comprising: a controller chip; a first memory chip; a second memory chip; and a data bus interconnecting the controller chip, the first memory chip and the second memory chip to each other; the first memory chip comprising: a first memory cell array; a first access control circuit responding to receipt of a first access command from the controller chip and accessing the first memory cell array to produce first read data therefrom; a plurality of first data terminals coupled to the data bus; a first data output circuit coupled between the first memory cell array and the first data terminals; and a first output timing adjustment circuit producing a first output clock signal in response to first adjustment data stored therein, the first output clock signal causing the first data output circuit to drive the first data terminals so that first output data based on the first read data appear at the first output terminals after a first period of time from the receipt of the first access command, the first period of time being adjustable in accordance with the first adjustment data; the second memory chip comprising: a second memory cell array; a second access control circuit responding to receipt of a second access command from the controller chip and accessing the second memory cell array to produce second read data therefrom; a plurality of second data terminals coupled to the data bus; a second data output circuit coupled between the second memory cell array and the second data terminals; and a second output timing adjustment circuit producing a second output clock signal in response to second adjustment data stored therein, the second output clock signal causing the second data output circuit to drive the second data terminals so that second output data based on the second read data appear at the second output terminals after a second period of time from the receipt of the second access command, the second period of time being adjustable in accordance with the second adjustment data; and the controller chip comprising: a plurality of third data terminals coupled to the data bus; and a command unit that is coupled to the third data terminals and controls, in response to the first and second output data supplied thereto through the data bus, at least one of the first and second memory chips to change at least one of the first and second adjustment data so that the first and second periods of time become approximately equal to each other.

In a still another embodiment, there is provided a memory system that includes a memory controller and a plurality of memory devices that have at least data terminals commonly connected to the memory controller and perform operations based on a command issued from the memory controller, wherein each of the memory devices includes a memory cell array, a data output circuit that outputs read data read from the memory cell array in response to a read command to the data terminal, and an output-timing adjustment circuit that adjusts an output timing of the read data that is output by the data output circuit, and the memory controller sets an adjustment amount of adjustment performed by the output-timing adjustment circuit such that delay times from when the read command is issued until when the read data is received match in the memory devices, by issuing a setting command to each of the memory devices.

In a still another embodiment, there is provided a method comprising: issuing a first command to each of a plurality memory chips while selecting respective ones of the memory chips in sequence, the memory chips being interconnected to each other through a data buss, each of the memory chips receiving, when selected, the first command and outputting read data onto the data bus after a time delay from receipt of the first command; measuring, in response to the read data outputted from respective ones of the memory chips, the time delays of respective ones of the memory chips; and issuing, in response to results of the measuring, a second command to selected one or ones of the memory chips while designating the selected one or one of the memory chips in sequence, each of the selected one or ones of the memory chips receiving, when designated, the second command and changing adjustment data stored therein, the adjustment data being used to adjust the time delay; the time delays of respective ones of the memory chips becoming approximately equal to each other by changing the adjustment data stored in each of the selected one or ones of the memory chips.

In a still another embodiment, there is provided a control method for a memory system that includes: evaluating an operation speed of a plurality of memory devices, by issuing a read command to each of the memory devices from a memory controller to receive read data from the memory devices; and matching delay times from when the read command is issued until when the read data is received in the memory devices, by issuing a setting command to each of the memory devices from the memory controller to cause the memory devices to hold corresponding adjustment codes.

According to the present invention, the memory controller issues a setting command to each of the memory devices and causes the memory devices to hold corresponding adjustment codes. Therefore, delay times in the memory devices can be matched without monitoring a delay time as needed.

BRIEF DESCRIPTION OF THE DRAWINGS

The above features and advantages of the present invention will be more apparent from the following description of certain preferred embodiments taken in conjunction with the accompanying drawings, in which:

FIG. 10A shows a state before the adjusting operation is performed, and FIG. 10B shows a state after the adjusting operation is performed.

DETAILED DESCRIPTION OF THE EMBODIMENTS

Preferred embodiments of the present invention will be explained below in detail with reference to the accompanying drawings.

Figure 1:
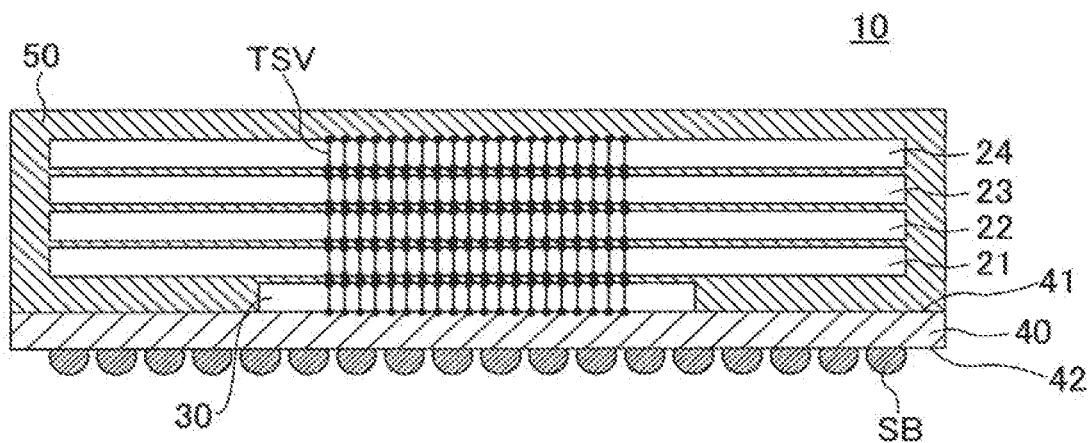
FIG. 1 is a schematic cross-sectional view for explaining a configuration of a memory system 10 according to a first embodiment of the present invention.

FIG. 1 is a schematic cross-sectional view for explaining a configuration of a memory system 10 according to a first embodiment of the present invention.

As shown in FIG. 1, the memory system 10 according to the first embodiment has four memory devices 21 to 24 and a memory controller 30 that are stacked with each other. Each of the memory devices 21 to 24 and the memory controller 30 is a one-chip semiconductor device that uses a silicon substrate. The memory devices 21 to 24 have mutually the same circuit configurations, and the memory devices 21 to 24 are general-purpose DRAM chips in the first embodiment, while these are not particularly limited thereto. Therefore, an access method of these memory devices is determined by a corresponding standard.

A general-purpose DRAM includes both a so-called, "front end unit" made of a circuit that performs interfacing with outside via an external terminal, and a so-called "back end unit" that includes a plurality of memory cell arrays and a circuit that accesses these memory cell arrays. A DDR3 (Double Data Rate 3) SDRAM (Synchronous Dynamic Random Access Memory) and the like correspond to the general purpose DRAM, although it is not particularly limited. The DDR3 SDRAM performs a so-called "prefetch operation" in an 8-bit unit. That is, in a read operation, 8-bit read data are read out in parallel from the back end unit by one access, and the front end unit performs parallel-serial conversion to the read data. As a result, the 8-bit read data are serially output to outside. On the other hand, in a write operation, 8-bit write data are serially input to the front end unit from outside by one access, and the front end unit performs serial-parallel conversion to the input data, and supplies a result of conversion in parallel to the back end unit. Therefore, a general-purpose DRAM used in the first embodiment is different from a so-called "core chip", in which only the back end unit is integrated with the front end unit removed.

In each of the memory devices 21 to 24, many through silicon vias TSV that penetrate a silicon substrate are provided, thereby electrically connecting vertically adjacent chips. Many through silicon vias TSV are also provided in the memory controller 30, thereby electrically connecting the chips and wirings provided on an upper surface 41 of an interposer 40. The memory controller 30 and the memory devices 21 to 24 are covered with an encapsulation resin 50, and thus chips axe physically protected thereby.

The interposer 40 is a circuit board made of resin, and has a plurality of external terminals (solder balls) SB formed on a back surface 42 of the interposer 40. The interposer 40 functions as a rewiring substrate to extend an electrode pitch, and functions to secure the mechanical strength of the memory system 10. That is, an electrode formed on the upper surface 41 of the interposer 40 is drawn out to the back surface 42 by through silicon vias, and a pitch of the external terminals SB is extended by the rewiring layer provided on the back surface 42. The number of the external terminals SB shown in FIG. 1 is only an example, and a larger number of external terminals are provided in practice.

Figure 2:
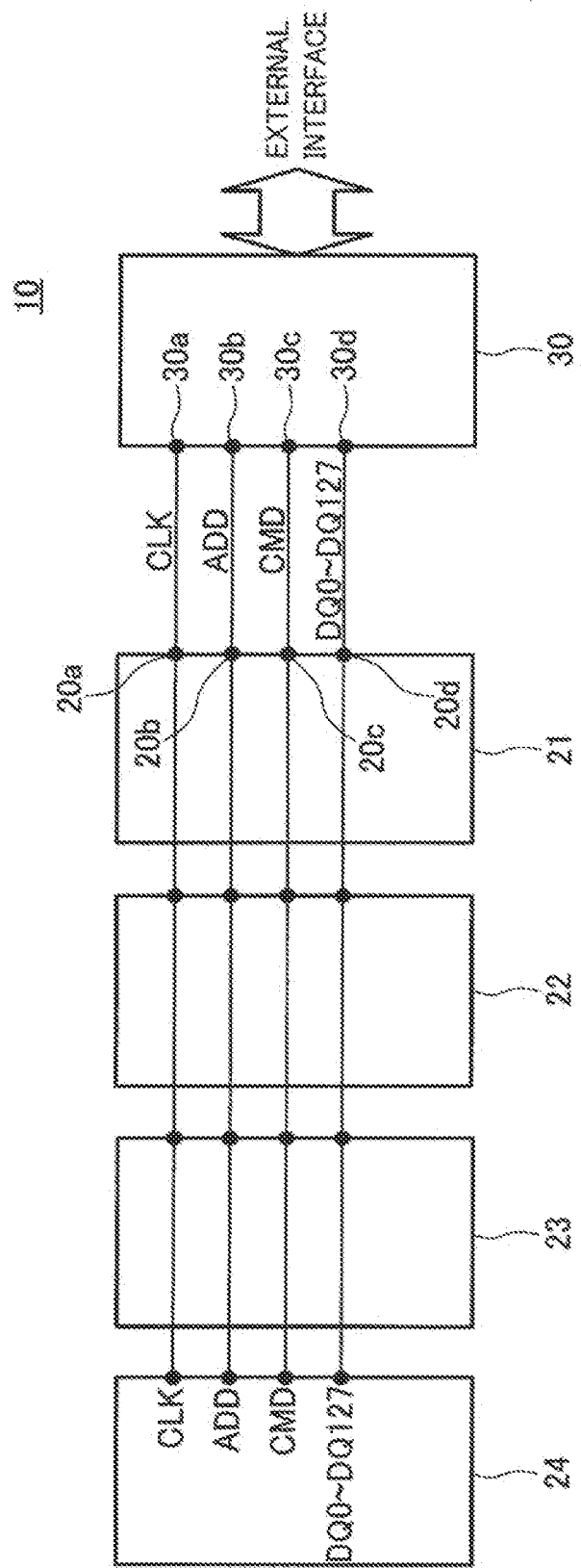
FIG. 2 is a block diagram for explaining a wiring structure of the memory system 10.

FIG. 2 is a block diagram for explaining a wiring structure of the memory system 10 according to the first embodiment.

As shown in FIG. 2, the four memory devices 21 to 24 are commonly connected to the memory controller 30. More specifically, a clock terminal 30a, an address terminal 30b, a command terminal 30c, and a data terminal 30d provided in the memory controller 30 are commonly connected to clock terminals 20a, address terminals 20b, command terminals 20c, and data terminals 20d provided is the memory devices 21 to 24. With this arrangement, an external clock signal CLK, an address signal ADD, and a command CMD that are output from the memory controller 30 are commonly supplied to the four memory devices 21 to 24. Read data DQ that are output from the memory devices 21 to 24 are input to the memory controller 30 via a common data bus. On the other hand, write data DQ that is output from the memory controller 30 is input to the memory devices 21 to 24 via a common data bus. In the first embodiment, although not particularly limited thereto, 128 data terminals are provided in each chip, thereby making it possible to transmit read data or write data of 128 bits at one time.

The memory controller 30 selects any one of the memory devices 21 to 24 using a chip selection signal. It suffices that a chip selection signal is supplied to the memory devices 21 to 24 using respective wires provided for the memory devices 21 to 24. On the other hand, in the case of supplying a chip selection signal to the memory devices 21 to 24 via a common wiring, it suffices that chip addresses are allocated to the memory devices 21 to 24, respectively, thereby selecting a memory device of which a value of a chip selection signal matches a chip address.

Figure 3:
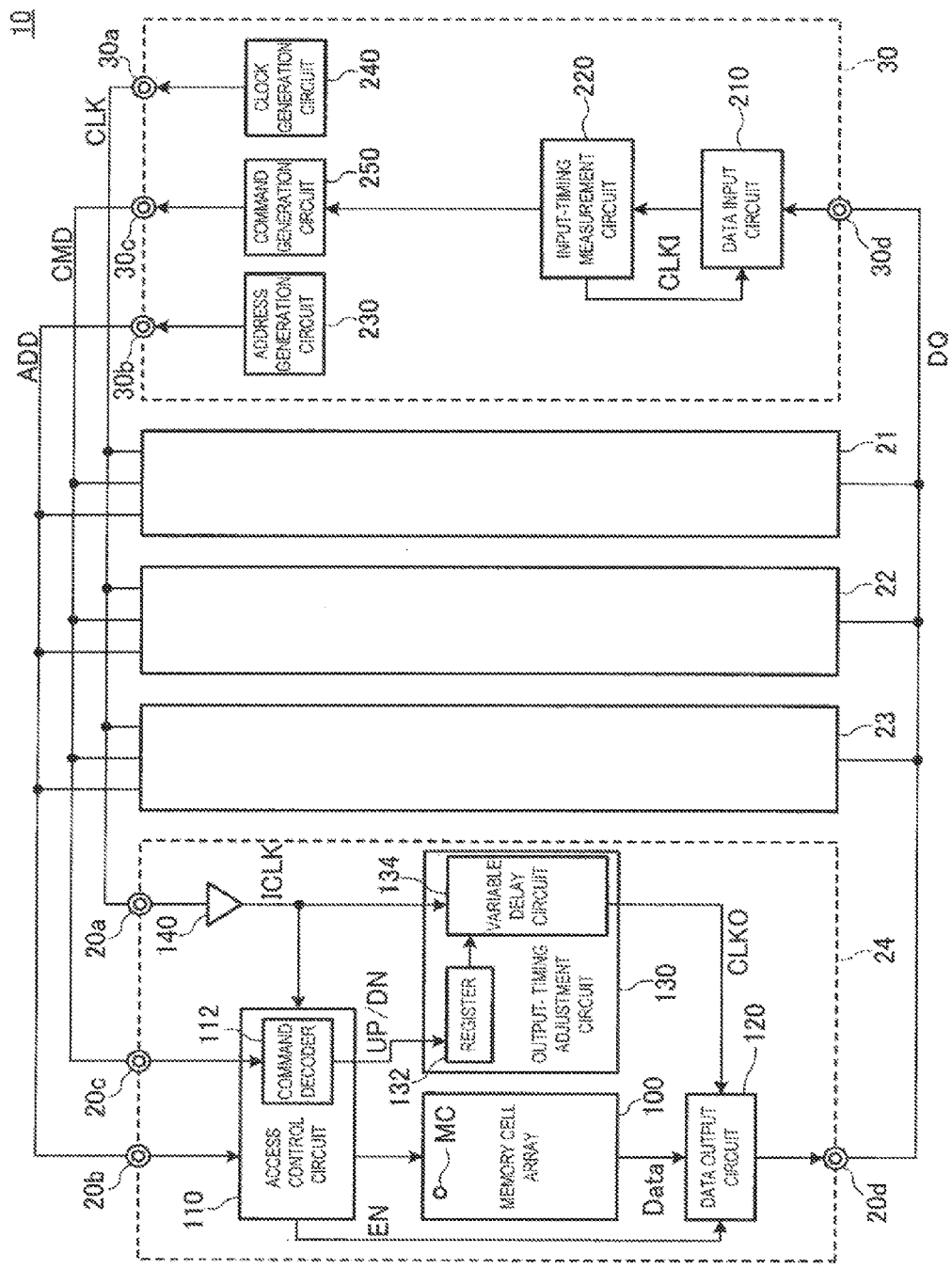
FIG. 3 is a block diagram for explaining a configuration of main units of memory devices 21 to 24 and a memory controller 30.

FIG. 3 is a block diagram for explaining a configuration of main units of the memory devices 21 to 24 and the memory controller 30. Because the memory devices 21 to 24 have mutually the same circuit configurations, FIG. 3 only shows a configuration of the memory device 24 as an example.

As shown in FIG. 3, the memory devices 21 to 24 include a memory cell array 100, an access control circuit 110 that performs an accessing operation to the memory cell array 100, a data output circuit 120 that outputs read data that is read from the memory cell array to the data terminal 20d, and an output-timing adjustment circuit 130 that adjusts an operation timing of the data output circuit 120. In FIG. 3, 128 data terminals 20d are collectively expressed as one data terminal 20d.

The memory cell array 100 includes many DRAM memory cells MC. Which one of the memory cells MC is to be accessed is designated by an address signal ADD supplied from the address terminal 20b. Specifically, the address signal ADD supplied from the address terminal 20b and the command CMD supplied from the command terminal 20c are input to the access control circuit 110, and when the command CMD is a read command, a read operation is performed on the memory cell MC specified by the address signal ADD, and read data Data that is read is supplied to the data output circuit 120. The data output circuit 120 outputs the read data to outside based on an output enable signal EN supplied from the access control circuit 110 and an output timing signal CLKO supplied from the output-timing adjustment circuit 130. The circuit configuration of the data output circuit 120 is described later.

As shown in FIG. 3, the access control circuit 110 includes a command decoder 112. The command decoder 112 decodes the command CMD supplied from the command terminal 20c and generates various internal signals based on a result of decoding. For example, when the command CMD is a read command, the command decoder 112 activates a read signal (not shown), thereby a read operation is performed. When the command CMD is a setting command, the command decoder 112 activates an up/down signal UP/DN. The up/down signal UP/DN is supplied to a register 132 included in the output-timing adjustment circuit 130, thereby an adjustment code as a set value of the register 132 is upcounted or downcounted.

The output-timing adjustment circuit 130 also includes a variable delay circuit 134. The variable delay circuit 134 receives an internal clock signal ICLK, and generates the output timing signal CLKO by delaying the internal clock signal ICLK. The amount of this delay is specified by an adjustment code that is set in the register 132. The internal clock signal ICLK is a signal obtained by buffering an external clock signal CLK supplied via the clock terminal 20a on a buffer circuit 140.

Figure 4:
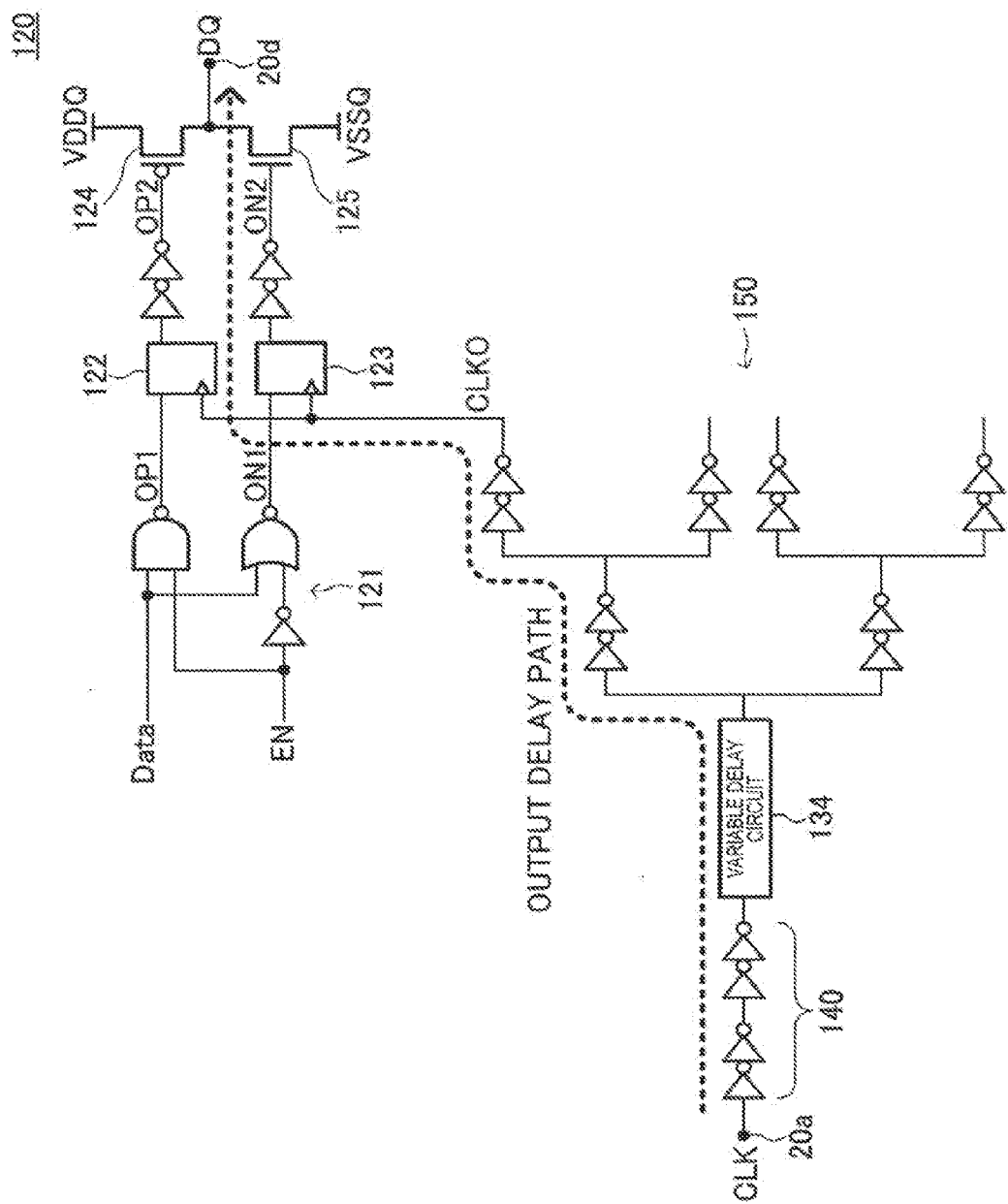
FIG. 4 is a circuit diagram of a data output circuit 120.

FIG. 4 is a circuit diagram of the data output circuit 120.

As shown in FIG. 4, the data output circuit 120 includes a logic circuit 121 that generates a P-side drive signal OP1 and an N-side drive signal ON1 by receiving the read data Data and the output enable signal EN, latch circuits 122 and 123 that latch the P-side drive signal OP1 and the N-side drive signal ON1, respectively, synchronously with the output timing signal CLKO, a pull-up buffer 124 that is on/off controlled by a P-side drive signal OP2 output from the latch circuit 122, and a pull-down buffer 125 that is on/off controlled by an N-side drive signal ON2 output from the latch circuit 123. The pull-up buffer 124 is made of a P-channel MOS transistor, and has a source connected to a high-order-side power source VDDQ and has a drain connected to the data terminal 20d. The pull-down buffer 125 is made of an N-channel MOS transistor, and has a source connected to a low-order-side power source VSSQ and has a drain connected to the data terminal 20d.

When the output enable signal EN is inactivated at a low level, the logic circuit 121 sets the P-side drive signal OP1 at a high level and sets the N-side drive signal ON1 at a low level, regardless of the logic value of the read data Data. With this configuration, both the pull-up buffer 124 and the pull-down buffer 125 are turned off, and the data terminal 20d becomes in a high impedance state. On the other hand, when the output enable signal EN is activated at a high level, the logic circuit 121 sets both the P-side drive signal OP1 and the N-side drive signal ON1 at a low level, when the read data Data is at a high level. When the read data Data is at a low level, the logic circuit 121 sets both the P-side drive signal OP1 and the N-side drive signal ON1 at a high level. Therefore, when the latch circuits 122 and 123 latch these signals, either the pull-up buffer 124 or the pull-down buffer 125 is turned on, and the data terminal 20a is driven at the same logic level as that of the read data Data.

As described above, the latch circuits 122 and 123 latch the P-side drive signal OP1 and the N-side drive signal ON1 synchronously with the output timing signal CLKO. As shown in FIG. 4, the output timing signal CLKO is generated when the external clock signal CLK that is input to the clock terminal 20a passes through she buffer circuit 140 and the variable delay circuit 134. As explained above, in the first embodiment, 128 data terminals 20d are provided in each of the memory devices 21 to 24. Therefore, the output timing signal CLKO that passes through the variable delay circuit 134 is branched by a clock tree 150, and branched clock trees distribute the output timing signal CLKO to respective data output circuits 120.

Referring back to FIG. 3, the memory controller 30 includes a data input circuit 210 that latches the read data DQ input via the data terminal 30d, synchronously with an input timing signal CLKI, an input-timing measurement circuit 220 that generates the input timing signal CLKI and measures an input timing of the read data DQ, and a command generation circuit 250 that issues a setting command based on a result of a measurement performed by the input-timing measurement circuit 220.

As described later in detail, the input-timing measurement circuit 220 is a circuit that determines, by continuously activating the input timing signal CLKI, a boundary between a timing when the data input circuit 210 can correctly fetch the read data DQ and a timing when the data input circuit 210 cannot correctly fetch the read data DQ.

The memory controller 30 also includes a clock generation circuit 240 that generates the external clock signal CLK and an address generation circuit 230 that generates the address signal ADD. The external clock signal CLK generated by the clock generation circuit 240 is output via the clock terminal 30a, and is commonly supplied, to the clock terminals 20a provided in the memory devices 21 to 24. Similarly, the command CMD generated by the command generation circuit 230 is output via the comma rd terminal 30c, and is commonly supplied to the command terminals 20c provided in the memory devices 21 to 24. The address signal ADD generated by the address generation circuit 230 is output via the address terminal 30b, and is commonly supplied to the address terminals 20b provided in the memory devices 21 to 24.

The configuration of the memory system 10 according to the first embodiment is as described above. An operation of the memory system 10 is explained below by focusing on an output-timing adjusting operation of the read data DQ.

Figure 5:
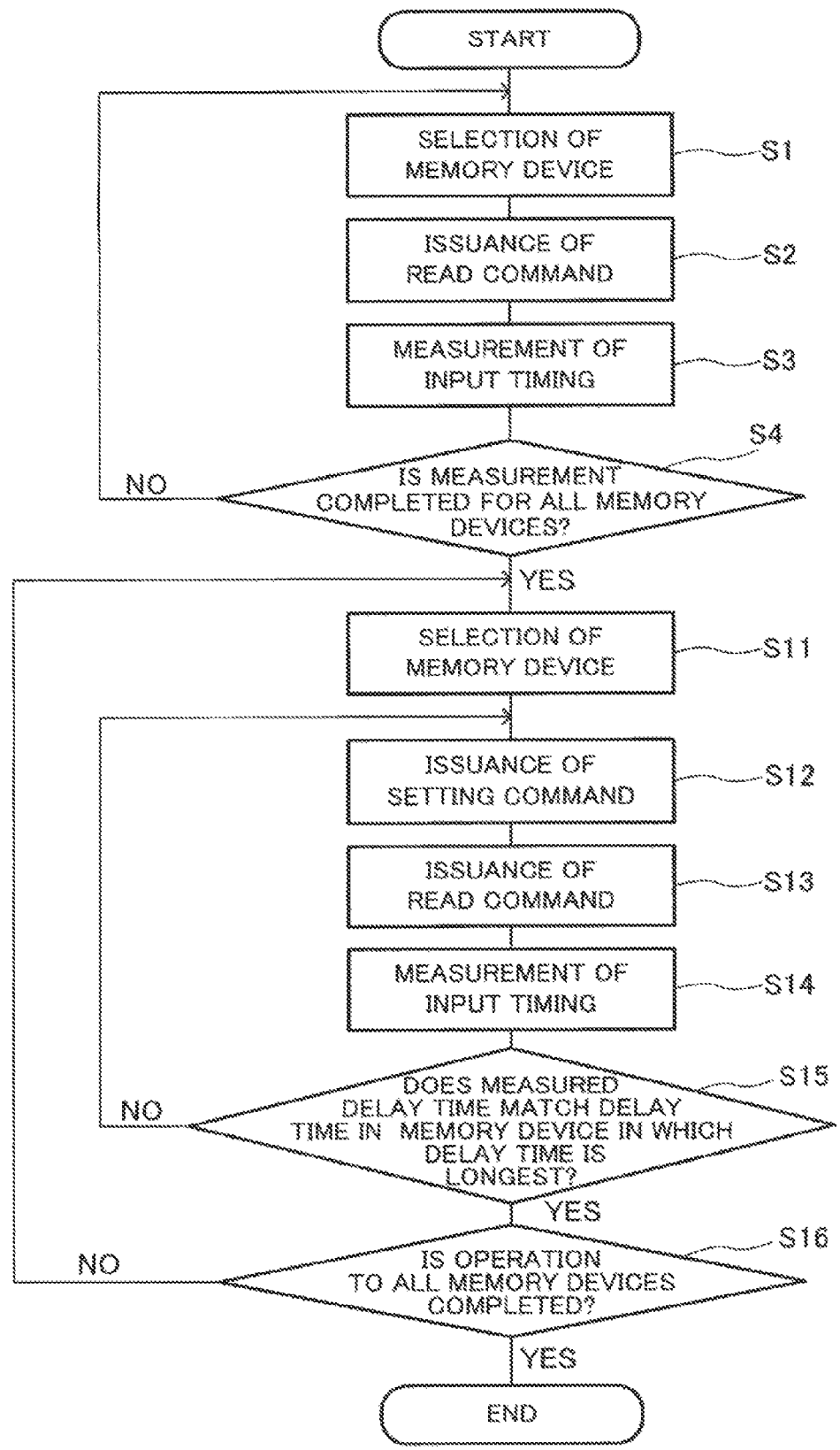
FIG. 5 is a flowchart for explaining an output-timing adjusting operation in the first embodiment.

FIG. 5 is a flowchart for explaining the output-timing adjusting operation of the read data DQ.

As shown in FIG. 5, in the output-timing adjusting operation of the read data DQ, any one of the memory devices 21 to 24 is selected first (Step S1), and a read command is issued to a selected memory device (Step S2). The read data DQ that is read out is fetched via the data input circuit 210 in the memory controller 30. At this time, by continuously activating the input timing signal CLKI, a timing when the read data DQ can be correctly fetched and a timing when the read data DQ cannot be correctly fetched are evaluated (Step S3). The input-timing measurement circuit 220 performs this evaluation. A specific evaluation method is described later in detail.

Next, another one of the memory devices 21 to 24 is selected (step S1), and an evaluation similar to that explained above is performed (Steps S2 and S3). After the evaluation is completed for all of the memory devices 21 to 24 (Step S4: YES), results of evaluating the memory devices 21 to 24 are verified, and the memory device in which the delay 20 time is the longest is specified. The input-timing measurement circuit 220 also performs this operation.

Next, any one of the memory devices 21 to 24 excluding the memory device in which the delay time is the longest is selected (Step 311), and a setting command is issued to a selected memory device (Step S12). Accordingly, the up/down signal UP/DP is activated in this memory device, and an adjustment code that is held in the register 132 is upcounted. When the adjustment code is upcounted, the amount of delay due to the variable delay circuit 134 increases. A read command is issued again to the selected memory device (Step S13), and the input timing signal CLKI is continuously activated, thereby an input timing is measured (Step S14). The above operation is identical to those of Steps S2 and S3 described above.

The delay time measured at Step S14 is compared with that in the memory device in which the delay time is the longest, and when the delay time measured at Step 314 is shorter (Step S15: NO), the process returns to Step S12, and a setting command is issued again. By repeating this process, when the delay time measured at Step S14 matches the delay time in the memory device in which the delay time is the longest (Step S15: YES), an adjusting operation to the corresponding memory device is completed. The process returns to Step S11, and an adjusting operation is performed for another memory device. When this operation is completed for all of the memory devices 21 to 24 excluding the memory device in which the delay time is the longest (Step S16: YES), a series of the output-timing adjusting operation is completed.

Preferably, the output-timing adjusting operation is performed each time when a power source is turned on or performed at each reset time. However, when the register 132 included in each of the memory devices 21 to 24 is nonvolatile, the output-timing adjusting operation is not required to be performed each time when a power source is turned on or performed at each reset time.

The output-timing adjust inn operation is explained below in detail.

Figure 6:
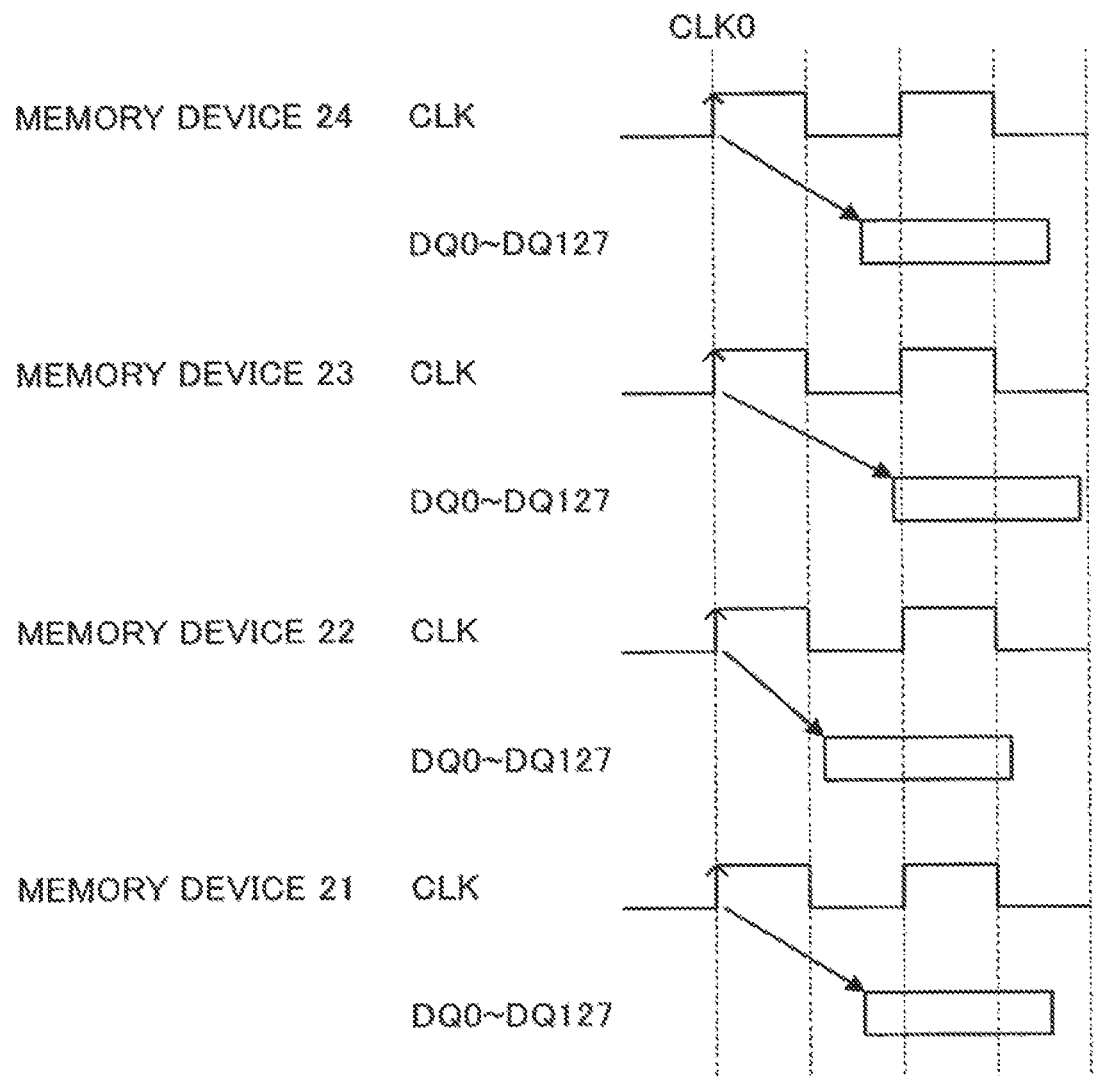
FIG. 6 is a timing diagram showing an example of an output timing of a read data DQ from the memory devices 21 to 24 before performing the output-timing adjusting operation.

FIG. 6 is a timing diagram showing an example of an output timing of the read data DQ from the memory devices 21 to 24 before performing the output-timing adjusting operation.

Before performing the output-timing adjusting operation, there is a variation in the operation speed among the memory devices 21 to 24. In the example shown in FIG. 6, the memory devices start output of the read data DQ based on an active edge CLK0 that is a reference of the external clock signal CLK, at timings in the order of the memory devices 22 and 21 (=24), and 23. That is, the delay time in the memory device 22 is the shortest, and the delay time in the memory device 23 is the longest. Note that, although the active edges CLK0 of the external clock signal CLK are displayed at aligned positions in FIG. 6, this is for the sake of explaining a difference in delay times among these memory devices. In practice, one memory device outputs the read data DQ to the active edge CLK0 at one time. That is, a plurality of memory devices do not simultaneously output the read data DQ based on the same active edge CLK0. This is because the data terminal 20d is commonly connected to the memory devices 21 to 24.

Figure 7:
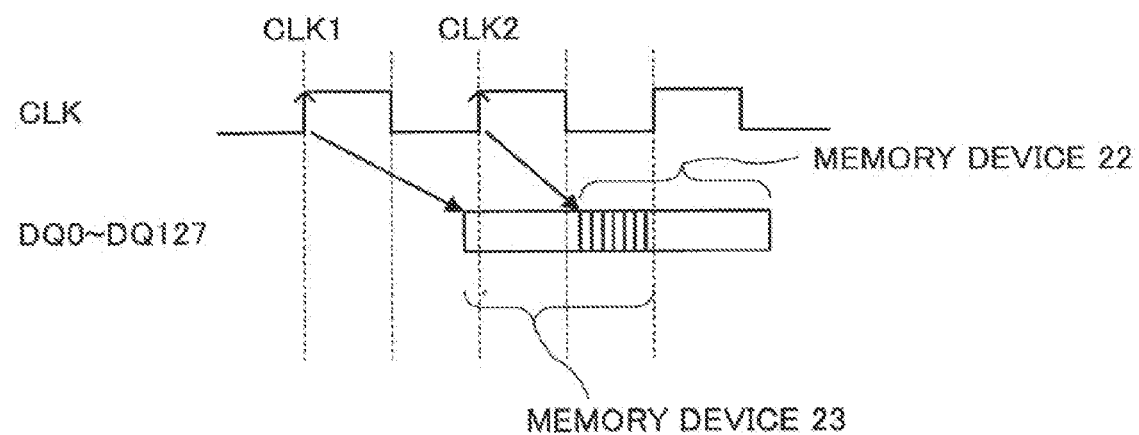
FIG. 7 is a timing diagram for explaining a state of occurrence of data collision.

As explained above, before performing the output-timing adjusting operation, there is a variation in output start timings of the read data DQ among the memory devices 21 to 24. Therefore, when the read data DQ are sequentially output from the memory devices 21 to 24, collision of the read data DQ occurs on a data bus. FIG. 7 is a timing diagram for explaining the collision. FIG. 7 shows a case that the memory device 22 in which the delay time is the shortest outputs the read data DQ based on an active edge CLK2 after the memory device 23 in which the delay time is the longest outputs the read data DQ based on an active edge CLK1. In this case, because the last part of the read data DQ from the memory device 23 and the top part of the read data DQ from the memory device 22 are output simultaneously, data collision occurs in this part. During a period in which there is data collision, the logic level of the read data DQ is indeterminate, and therefore the memory controller 30 cannot correctly fetch the read data DQ. Accordingly, if this state continues, an effective width (a pass window) of the read data DQ becomes narrower. In addition, when the logic levels of the read data DQ from the memory devices 22 and 23 are different from each other, a through current flows during a duplicating period of the read data DQ.

Figure 8:
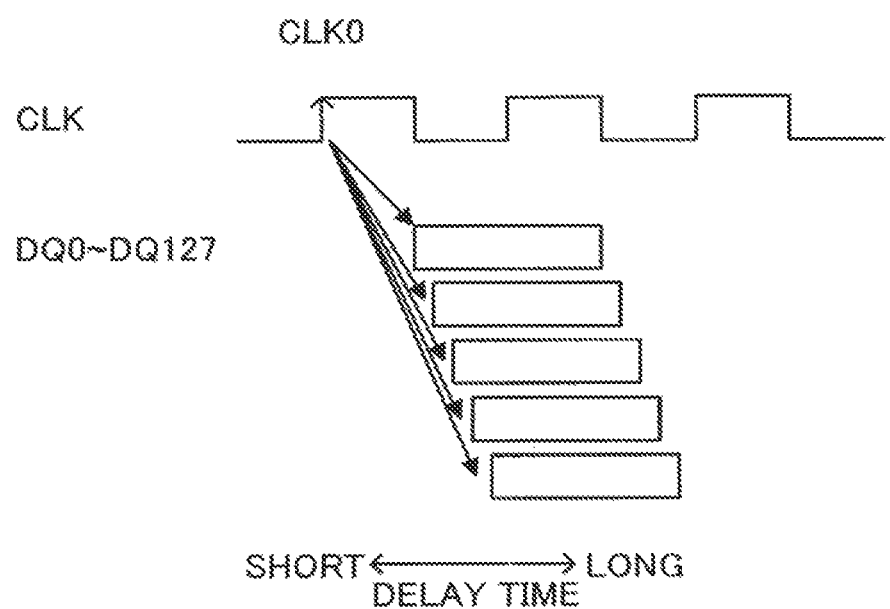
FIG. 8 is a timing diagram for explaining a state that an output timing of the read data DQ can be adjusted.

A problem due to the difference in delay times can be solved by matching the delay times in the memory devices 21 to 24 by adjusting output timings of the read data DQ as shown in FIG. 8 by using the output-timing adjustment circuit 130. The level of the delay time is determined based on a result of a measurement performed by the input-timing measurement circuit 220 provided in the memory controller 30. The measurement by the input-timing measurement circuit 220 is performed by trying fetching of the read data DQ that is output from a certain memory device at plural timings, and by determining a boundary between a timing when the read data DQ can be fetched correctly and a timing when the read data DQ cannot be fetched correctly, as shown in FIG. 9.

Figure 9:
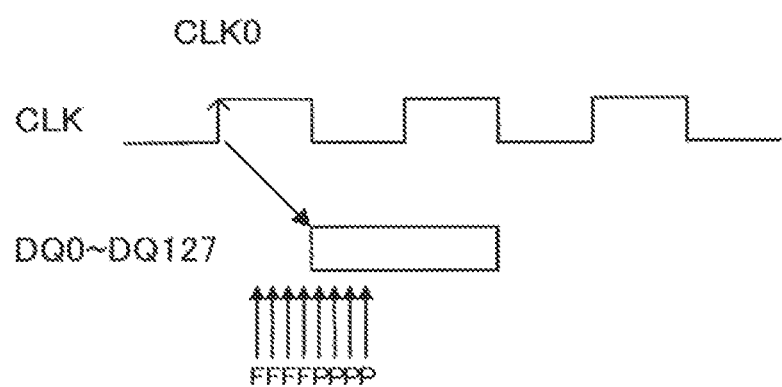
FIG. 9 is a timing diagram for explaining a relationship between a case of performing a pass determination (P) and that of performing a fail determination (F)

Specifically, the input-timing measurement circuit 220 shown in FIG. 3 continuously activates the input timing signal CLKI, and when the data input circuit 210 can correctly fetch the read data DQ by this activation, this is determined as "pass" (the reference character "P" shown in FIG. 9), and when the data input circuit 210 cannot correctly fetch the read data DQ by this activation, this is determined as "fail" (the reference character "F" shown in FIG. 9). Such a determination can be performed for all bits of 128-bit read data DQ, or for only one bit of the 128-bit read data DQ as a representative. When there is a variation in the operation speed between 128-bit read data DQ in the former method, it suffices that the slowest read data DQ is employed as the operation speed of the corresponding memory device.

A more high-precision measurement becomes possible as the frequency of the input timing signal CLKI is higher, and therefore, preferably, the input timing signal CLKI has a highest frequency that the memory controller 30 can permit.

When this measurement is performed, as shown in FIG. 9, a fail determination (F) at an initial stage changes to a pass determination (P) at a certain timing. This change timing represents the delay time in the memory device. A specific pass determination (P) or fail determination (F) is performed by comparing an expected value to the read data DQ. That is, when the expected value and the read data DQ match each other, it is determined as "pass" (P), and when the expected value and the read data DQ do not match each other, it is determined as "fail" (F). Therefore, needless to mention, an expected value is written in advance as a prerequisite for determinations in the memory device.

Figure 10:
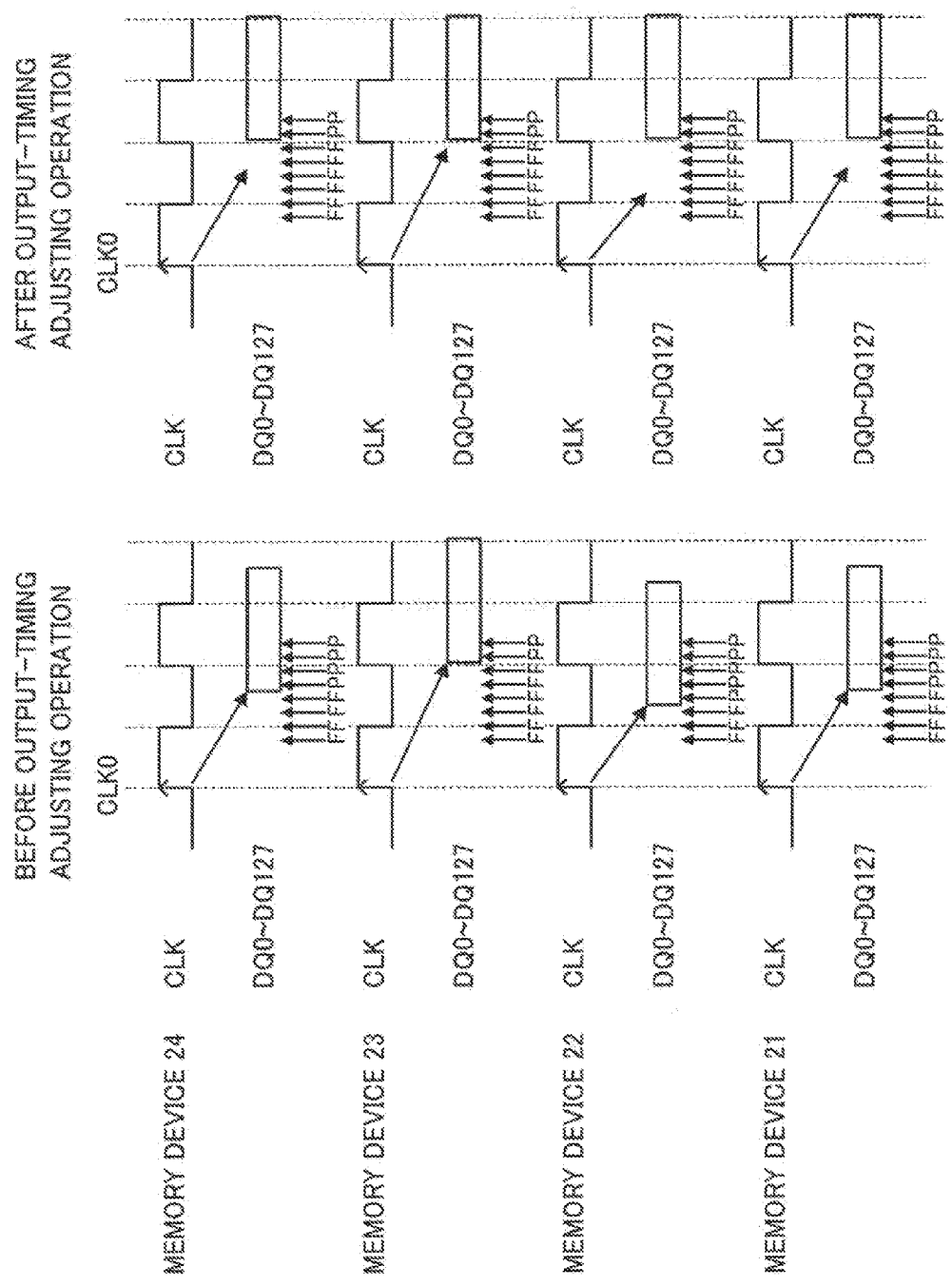
FIGS. 10A and 10B are timing diagrams for explaining output timings of the read data DQ before and after an output-timing adjusting operation is performed, where

FIGS. 10A and 10B are timing diagrams for explaining output timings of the read data DQ before and after an output-timing adjusting operation is performed, where FIG. 10A shows a state before the output-timing adjusting operation is performed, and FIG. 10B shows a state after the adjusting operation is performed.

As shown in FIG. 10A, when the input-timing measurement circuit 220 measures input timings in the memory devices 21 to 24 in which delay times thereof are different, timings when the fail determination (F) is switched to the pass determination (P) are different in the memory devices 21 to 24. Specifically, in the memory devices 21 and 24, the pass determination (P) appears at a fifth time after the fail determination (F) lasts four times. On the other hand, in the memory device 22, the pass determination (P) appears at a fourth time after the fail determination (F) lasts three times. In the memory device 23, the pass determination (P) appears at a seventh time after the fail determination (F) lasts six times.

The input-timing measurement circuit 220 shown in FIG. 3 specifies a memory device in which the delay time is the longest, based on such a determination result. In this case, it suffices that the delay time is extended such that the pass determination (P) appears at a seventh time after the fail determination (F) lasts six times in the memory devices 21, 22, and 24. Therefore, it suffices that the delay time is increased by two pitches in the memory devices 21 and 24, and that a delay time is increased by three pitches in the memory device 22. As explained above, the delay time is increased by activating the up/down signal UP/DN once or twice or more to issue a setting command to the memory devices 21, 22, and 24.

Figure 11:
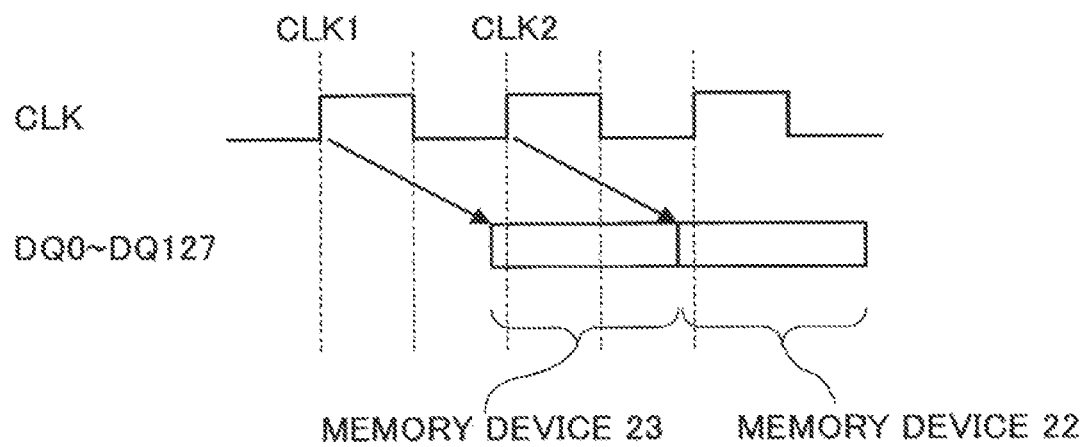
FIG. 11 is a timing diagram for explaining a state of non-occurrence of data collision.

When such adjustment is performed, as shown in FIG. 10B, times taken from the active edge CLK0 to output of the read data DQ in each of the memory devices 21 to 24 substantially match each other. As a result, as shown in FIG. 11, any data collision does not occur even when the memory devices 22 and 23 are continuously accessed. Consequently, an effective width (a pass window) of the read data DQ can be sufficiently secured, and a through current does not flow.

As explained above, according to tire memory system 10 of the first embodiment, the difference in delay times in the memory devices 21 to 24 can be substantially eliminated. Therefore, problems such as data collision or occurrence of a through current do not occur even when a read access is performed continuously to the memory devices 21 to 24. Further, because a delay time is adjusted when a power source is turned on or at a reset time, the delay time is not required to be adjusted in real time at a time of actual access. Therefore, even when a data transfer speed is considerably high, a variation in the delay time can be reliably cancelled.

Further, in the first embodiment, because an adjustment code is upcounted by each one pitch while actually measuring the delay time (Steps S12 to S15), remarkably accurate adjustment becomes possible. However, in the present invention, it is not essential to upcount an adjustment code by each one pitch while actually measuring a delay time, and an adjustment code can be directly input to the registers 132 of the memory devices 21 to 24. An embodiment of directly inputting an adjustment code to the registers 132 of the memory devices 21 to 24 is explained below.

Figure 12:
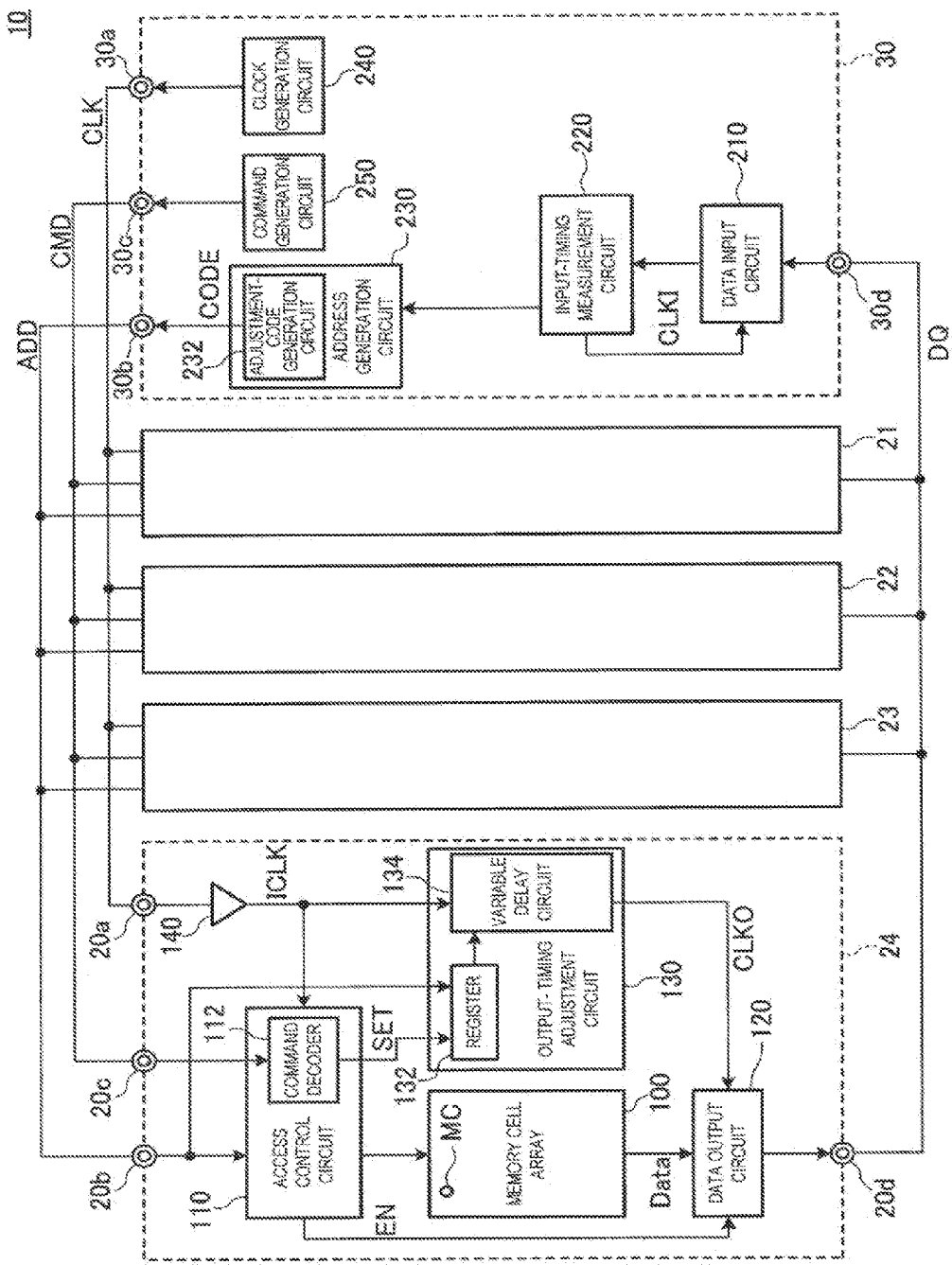
FIG. 12 is a block diagram for explaining a configuration of main units of memory devices 21 to 24 and memory controller 30 in a second embodiment of the present invention

FIG. 12 is a block diagram for explaining a configuration of main parts of memory devices 21 to 24 and a memory controller 30 according to a second embodiment of the present invention.

As shown in FIG. 12, in the second embodiment, when the memory controller 30 issues a setting command, a command decoder 112 that is included in each of the memory devices 21 to 24 activates a set signal SET. The set signal SET is supplied to a register 132, and when the register 132 is activated, an adjustment code as a set value of the register 132 can be overwritten. As shown in FIG. 12, the adjustment code is supplied from an address terminal 20*b*.

Meanwhile, an address generation circuit 230 included in the memory controller 30 includes an adjustment-code generation circuit 232 that generates an adjustment code CODE based on a result of a measurement performed by an input-timing measurement circuit 220. The adjustment code CODE generated by the adjustment-code generation circuit 232 is output via an address terminal 30*b*, and is commonly supplied to the address terminals 20*b* provided in the memory devices 21 to 24.

Figure 13:
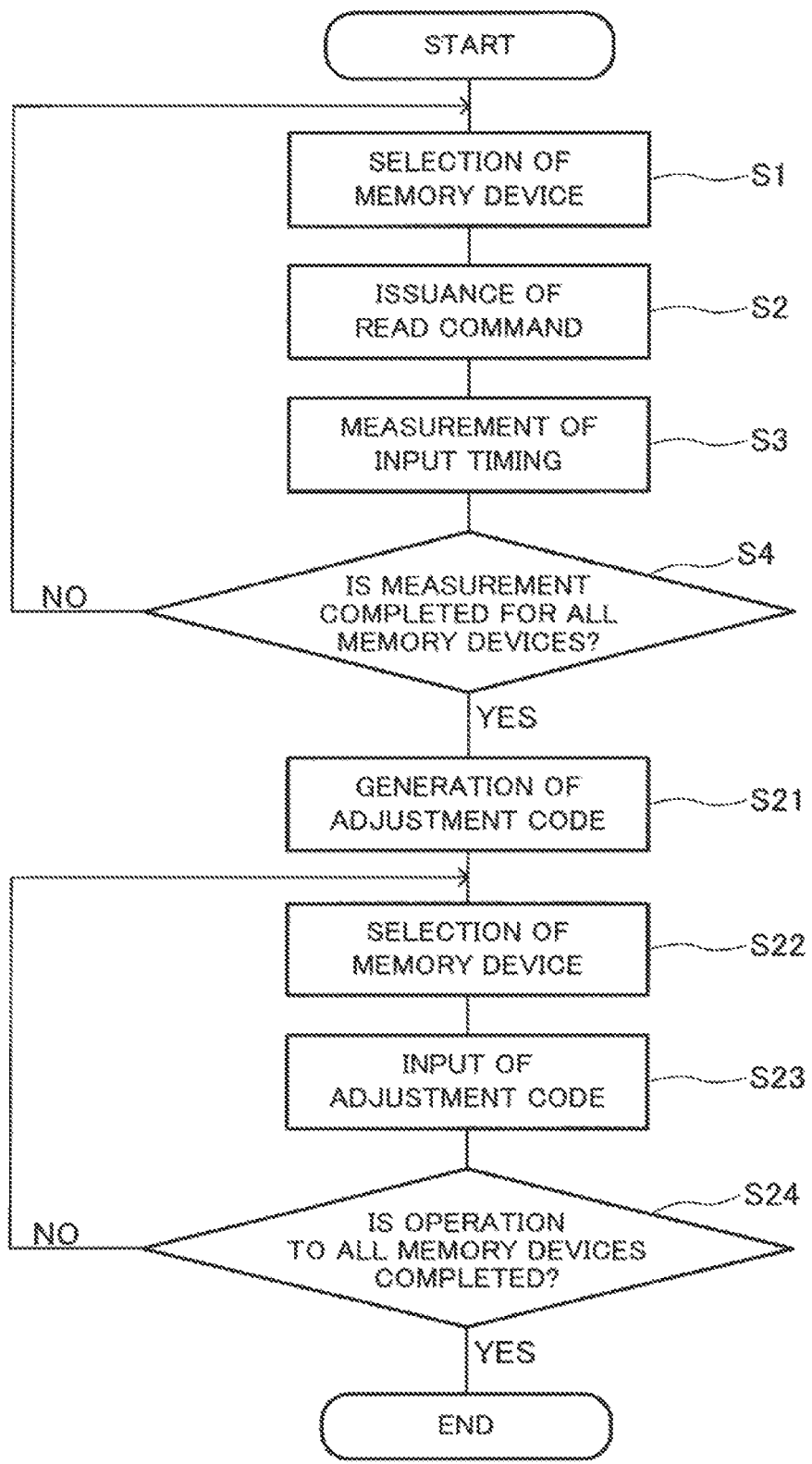
FIG. 13 is a flowchart for explaining an output-timing adjusting operation in the second embodiment.

FIG. 13 is a flowchart for explaining an output-timing adjusting operation in the second embodiment.

As shown in FIG. 13, the output-timing adjusting operation in the second embodiment is the same as the operation at Steps S1 to S4 shown in FIG. 5. After the evaluation is completed for all of the memory devices 21 to 24 (Step S4: YES), results of evaluating the memory devices 21 to 24 are verified, and the adjustment code CODE is generated to each of the memory devices 21 to 24 (Step 321). The adjustment-code generation circuit 232 generates the adjustment code CODE.

Next, any one of the memory devices 21 to 24 is selected (Step S22), a setting command is issued to a selected memory device, and the adjustment code CODE is supplied to this memory device (Step S23). Accordingly, the corresponding adjustment code CODE is written into the register 132 of this memory device. After this operation being performed for all of the memory devices 21 to 24 (Step S14: YES), a series of output-timing adjusting operation is completed.

Also in the second embodiment, the output-timing adjusting operation is preferably performed each time when a power source is turned on or performed at each reset time. However, when the registers 132 included in the memory devices 21 to 24 are nonvolatile, the output-timing adjusting operation is not required to be performed each time when a power source is turned on or performed at each reset time. When a circuit that stores therein the adjustment code CODE in a non-volatile manner is provided at a memory controller 30 side, Steps S1 to S4 shown in FIG. 13 are not required to be performed each time when a power source is turned on or performed at each reset time, and it suffices to perform only Steps S22 to S24.

As explained above, in the second embodiment, because the adjustment code is directly input to the registers of the memory devices 21 to 24, the output-timing adjusting operation can be completed quickly.

In the embodiments described above, although output timing of the 128-bit read data DQ are collectively adjusted, adjustment of the output timings in the present invention is not limited thereto. The output timings can be also adjusted in each group of the read data DQ by classifying the read data DQ of a plurality of bits that are output simultaneously into groups.

Figure 14:
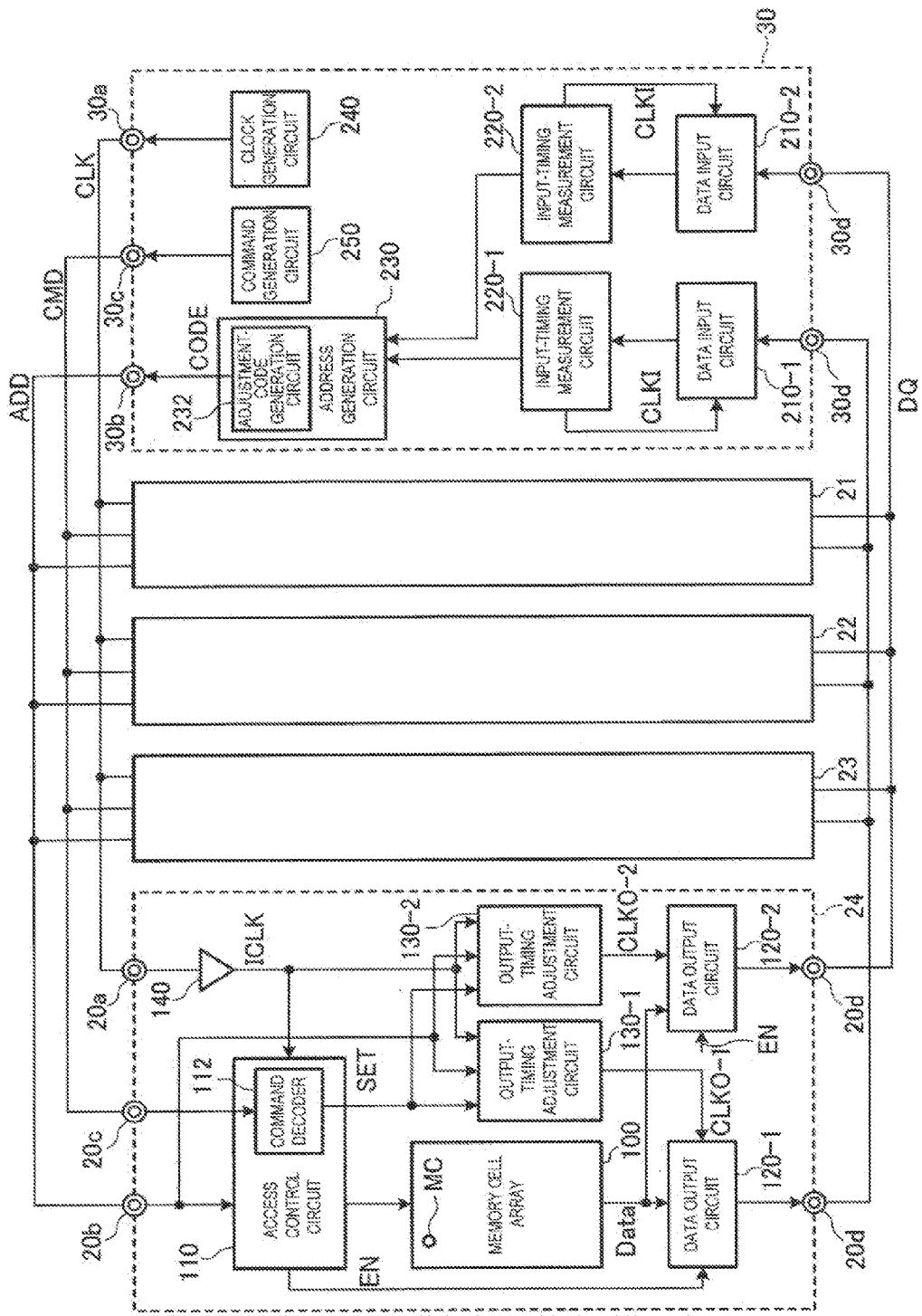
FIG. 14 is a block diagram showing an example of adjusting output timings of each group as the read data DQ is classified into two groups.

FIG. 14 is a block diagram showing an example of adjusting output timings of each group as the read data DQ is classified into two groups.

In the example shown in FIG. 14, two output-timing adjustment circuits 130-1 and 130-2 are provided in each of the memory devices 21 to 24. The output-timing adjustment circuit 130-1 supplies an output timing signal CLKO-1 to a data output circuit 120-1 that outputs 64-bit read data DQ, and the output-timing adjustment circuit 130-2 supplies an output timing signal CLKO-2 to a data output circuit 120-2 that outputs the rest of 64-bit read data DQ.

Two data-input circuits 210-1 and 210-2 and two input-timing measurement circuits 220-1 and 220-2 are provided at a memory controller 30 side. The input-timing measurement circuits 220-1 and 220-2 measure input timings of the read data DQ of corresponding groups, respectively.

This configuration is suitable for a case when an output timing of the read data DQ is slightly different in each group due to a layout of data terminals on a chip. For example, when 64 data terminals as a half of 128 data terminals 20*d* are integrally arranged in a certain area on a chip and also when the rest of 64 data terminals are integrally arranged in other areas on the chip, a time difference hardly occurs between the read data DQ that are output from respective 64 data terminals that are integrally arranged. However, occasionally, a non-negligible time difference occurs between the read data DQ that are output from data terminals located in different areas. In this case, as shown in the example of FIG. 14, it is preferred that the read data DQ are grouped by areas in which the data terminals 20*d* are arranged and output timings of the read data DQ are adjusted in each of the groups.

Figure 15:
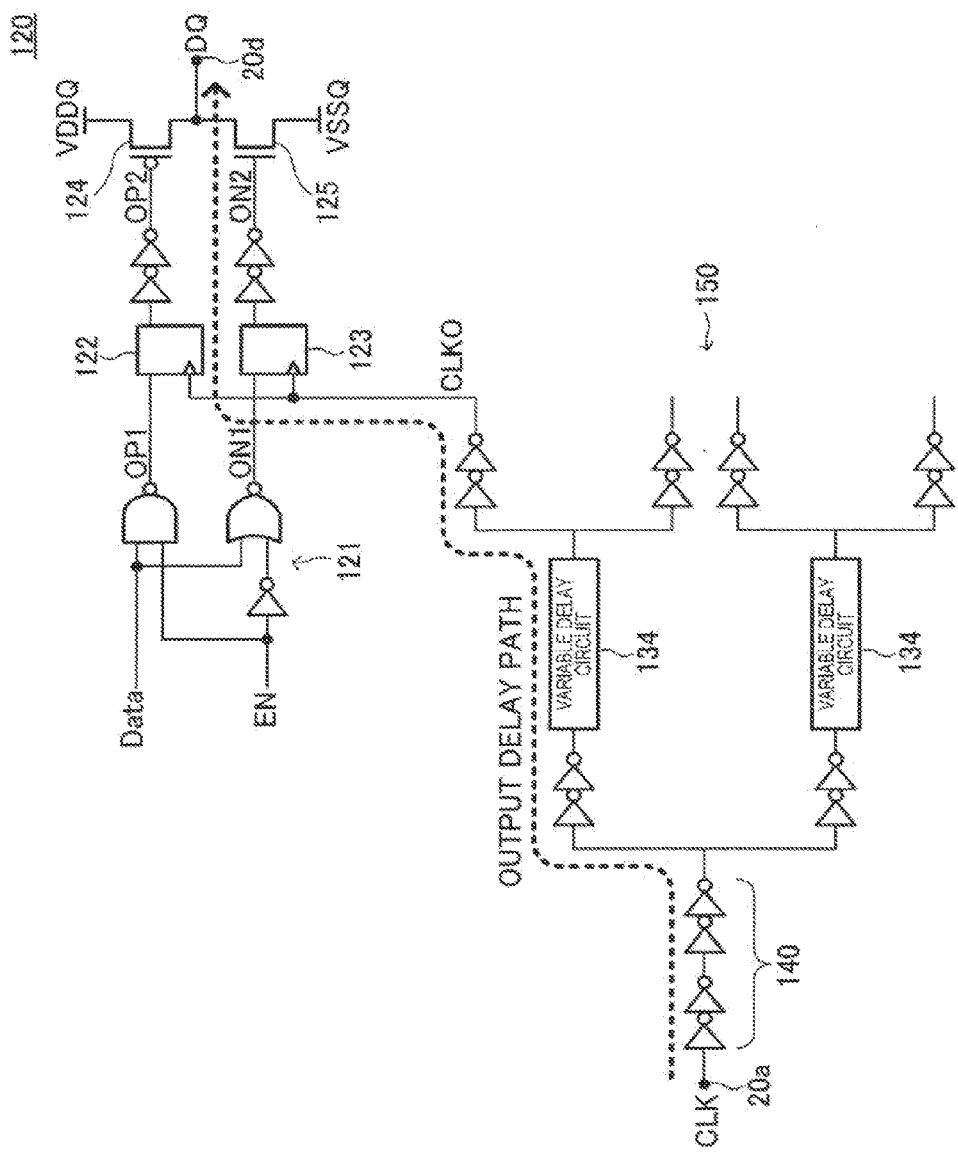
FIG. 15 is a circuit diagram showing an example that two variable delay circuits 134 are respectively inserted into the middle of a clock tree 150.

In this case, as shown in FIG. 15, an optimum delay amount can be obtained for each of the groups by inserting two variable delay circuits 134 into the middle of the clock tree 150.

Figure 16:
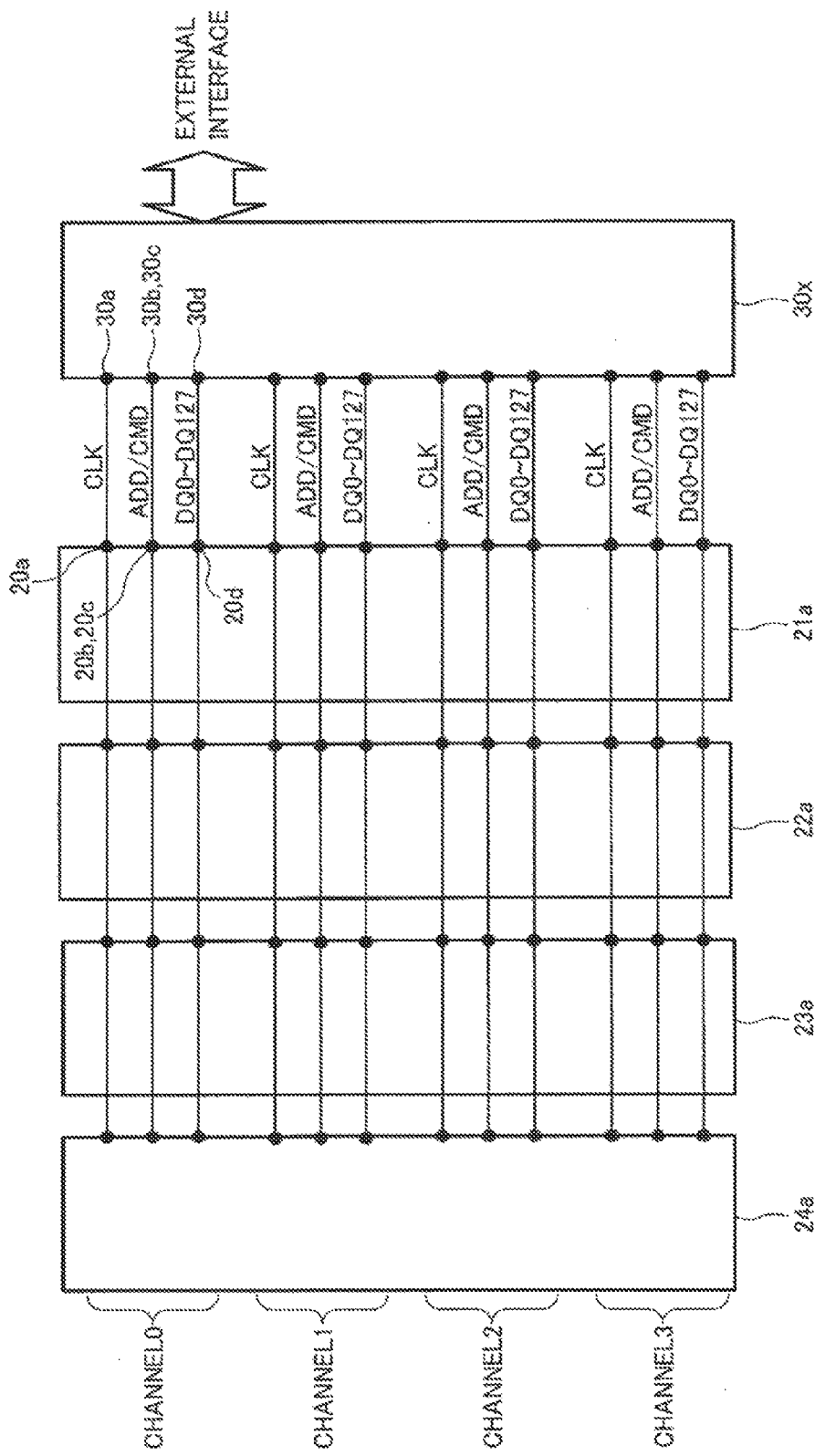
FIG. 16 is a block diagram for explaining a wiring structure of a memory system according to a modification.

FIG. 16 is a block diagram for explaining a wiring structure of a memory system according to a modification.

In an example shown in FIG. 16, each of memory devices 21*a* to 24*a* has four channels (channels 0 to 3), and the channels are commonly connected to a memory controller 30*x*. A clock terminal 20*a*, an address terminal 20*b*, a command terminal 20*c*, and a data terminal 20*d* are provided in each channel of the memory devices 21*a* to 24*a*, and these terminals are connected to a clock terminal 30*a*, an address terminal 30*b*, a command terminal 30*c*, and a data terminal 30*d* of corresponding channels of the memory controller 30*x*.

Figure 17:
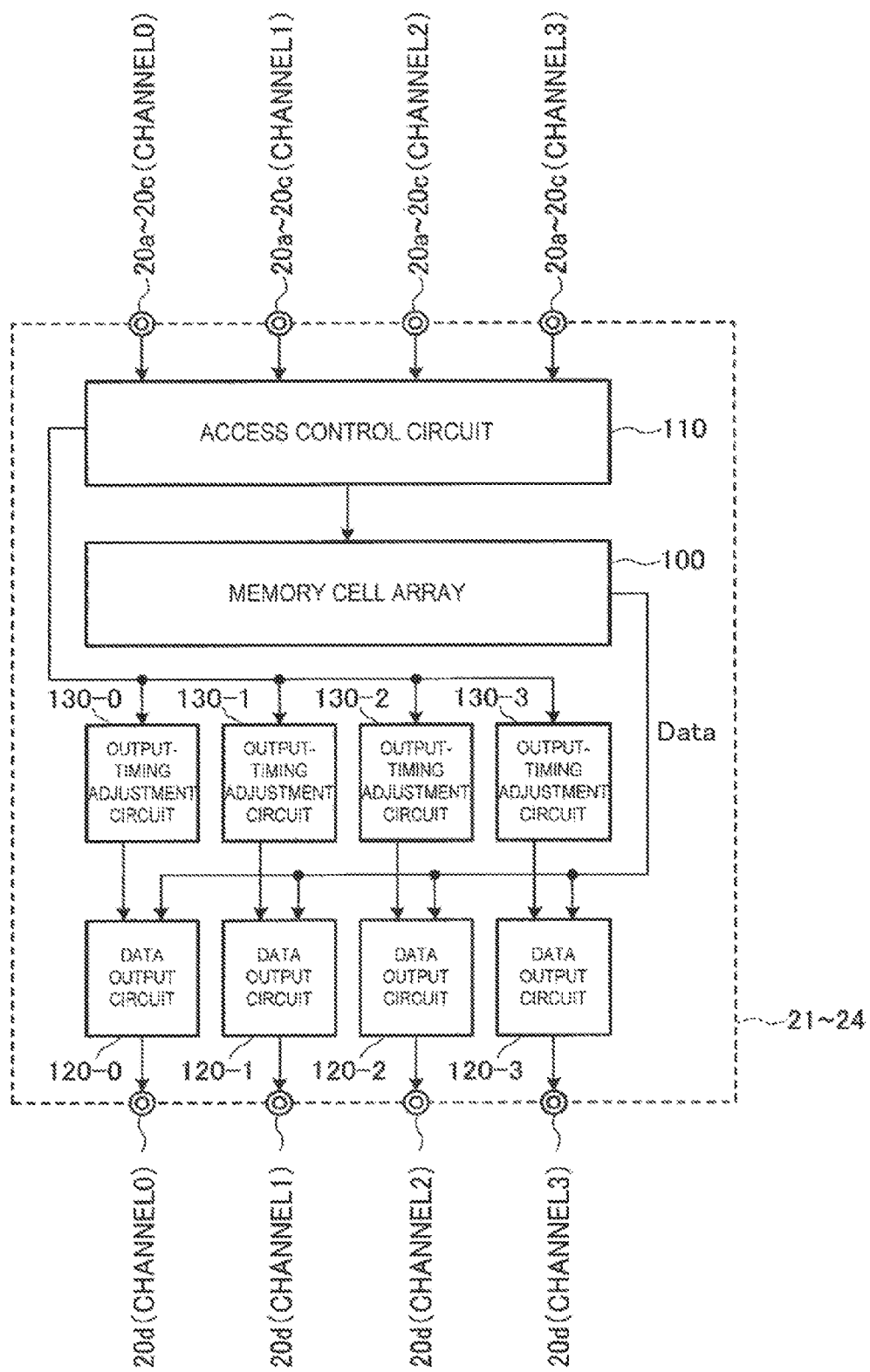
FIG. 17 is a block diagram for explaining a structure of memory devices 21 to 24 according to the modification.

When a memory system has such a configuration, as shown in FIG. 17, it is preferred that output-timing adjustment circuits 130-0 to 130-3 and data output circuits 120-0 to 120-3 are provided in each channel, thereby making it possible to adjust output timings of the read data DQ in each channel. In this case, 128-bit read data DQ that belongs to one channel can be also classified into several groups and output timings can be adjusted in each group, instead of collectively adjusting output timings of 128-bit read data DQ that belongs to one channel.

It is apparent that the present invention is not limited to the above embodiments, but may be modified and changed without departing from the scope and spirit of the invention.

For example, although the above embodiments have explained an example of a memory system in which one memory controller and a plurality of memory devices are stacked, the present invention is not limited thereto. Note that, as explained in the above embodiments, when a memory controller and a plurality of memory devices are stacked and also when these are connected to each other by through silicon vias, there will be almost no difference in wiring loads and the like. Therefore, a time difference of read data among the memory devices is substantially determined by an operation speed difference among the memory devices. As this point is taken into consideration, the present invention is most suitable for application to stacked memory systems.

Furthermore, in the above embodiments, clock terminals, address terminals, and command terminals provided in memory devices are commonly connected to a memory controller; however, in the present invention, it suffices that at least data terminals provided in the memory devices are commonly connected to the memory controller, and thus it is not essential that clock terminals, address terminals, and command terminals are commonly connected. However, the present invention is suitably applied to a memory system in which these terminals are also commonly connected.

What is claimed is:

1. A method for adjusting output, timing of a plurality of memory devices, the method comprising the steps of:
   providing a clock signal to each of the plurality of memory devices, wherein each one of the plurality of memory devices delays the clock signal in a respective variable delay circuit to provide a respective output clock signal;
   sequentially issuing read commands to each of the plurality of memory devices, whereby each one of the plurality of memory devices provides read data in synchronization with the respective output clock signal;
   receiving read data from each of the plurality of memory devices;
   determining a respective delay time for each of the plurality of memory devices, wherein the respective delay time is indicative of an elapsed period between a time at which the read command is issued to the respective memory device and a time at which the read data is provided by the respective memory device;
   identifying a slowest memory device as the memory device having the longest delay time; and
   adjusting the respective variable delay circuit in each of the plurality of memory devices other than the slowest memory device so as to make the delay time for the memory device substantially the same as the delay time of the slowest memory device.

2. The method of claim 1 wherein the plurality of memory devices are stacked.

3. The method of claim 2 wherein the plurality of memory devices are interconnected by through electrodes.

4. The method of claim 1 wherein the plurality of memory devices are dynamic random access memory devices.

5. The method of claim 1 wherein adjusting the respective variable delay circuit in each of the plurality of memory devices comprises issuing a setting command.

6. The method of claim 5 wherein the setting command comprises an up/down signal.

7. The method of claim 6 wherein the step of issuing the setting command is repeated until the delay time of the respective memory device is substantially the same as the delay time of the slowest memory device.

8. The method of claim 5 wherein the setting command comprises an adjustment code.

9. The method of claim 1 wherein variable delay circuit comprises a register specifying a period by which the variable delay circuit is to delay the clock signal of the respective memory device.

10. The method of claim 9 wherein the register is non-volatile.

11. The method of claim 1 wherein the output timing of the plurality of memory devices is adjusted responsive to a power source being turned on.

12. The method of claim 1 wherein the output timing of the plurality of memory devices is adjusted responsive to determining that a reset has been performed.

* * * * *

UNITED STATES PATENT AND TRADEMARK OFFICE
CERTIFICATE OF CORRECTION

| | |
|---|---|
| PATENT NO. | : 8,947,943 B2 |
| APPLICATION NO. | : 14/295707 |
| DATED | : February 3, 2015 |
| INVENTOR(S) | : Toru Ishikawa |

It is certified that error appears in the above-identified patent and that said Letters Patent is hereby corrected as shown below:

In the Claims

Claim 1, Col. 13, line 20, the "," between the words "output" and "timing" should be deleted Signed and Sealed this
Twelfth Day of May, 2015

Michelle K. Lee
*Director of the United States Patent and Trademark Office*